United States Patent
Matsuda

(12) 
(10) Patent No.: US 6,423,602 B2
(45) Date of Patent: Jul. 23, 2002

(54) CIRCUIT MANUFACTURING METHOD AND APPARATUS, ANNEAL CONTROL METHOD AND APPARATUS, INFORMATION STORAGE MEDIUM

(75) Inventor: Tomoko Matsuda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/834,032

(22) Filed: Apr. 12, 2001

(30) Foreign Application Priority Data

Apr. 13, 2000 (JP) ........................................ 2000-112335

(51) Int. Cl.⁷ ............................................ H01L 21/331
(52) U.S. Cl. .................. 438/308; 438/197; 438/239; 438/241
(58) Field of Search ................ 438/308, 197, 438/239, 241, 166

(56) References Cited

U.S. PATENT DOCUMENTS 6,194,254 B1 * 2/2001 Takemura ................... 438/166
6,258,640 B1 * 7/2001 Miyazaki ..................... 438/197
6,261,971 B1 * 7/2001 Maekawa et al. ........... 438/766
2001/0031537 A1 * 10/2001 Matsuda ..................... 438/308

* cited by examiner

Primary Examiner—John F. Niebling
Assistant Examiner—Olivia T Luk
(74) Attorney, Agent, or Firm—Hayes Soloway P.C.

(57) ABSTRACT

A silicon substrate including an impurity doped thereinto is raised in temperature to a predetermined annealing temperature, and then the temperature of the silicon substrate reaching the annealing temperature is decreased at variable speeds such that the temperature is decreased at a high speed initially and a low speed latterly. The temperature of the silicon substrate is decreased at such a speed as the impurity with a reduced solid solubility due to the decreased temperature is not acted upon by thermal energy to disconnect the impurity from the silicon substrate.

12 Claims, 10 Drawing Sheets

CIRCUIT MANUFACTURING METHOD AND APPARATUS, ANNEAL CONTROL METHOD AND APPARATUS, INFORMATION STORAGE MEDIUM

BACKGROUND OF THE INVENTION

1. Field of the Invention

The present invention relates to a circuit manufacturing method and apparatus for activating an impurity ion-implanted into a silicon substrate through annealing, an anneal control method and apparatus for controlling the operation of the circuit manufacturing apparatus, and an information storage medium for storing a program as software which causes a computer for controlling the operation of the circuit manufacturing apparatus to perform various processing operations.

2. Description of the Related Art

In recent years, MOS transistors for use in logic circuits and the like have LDD (Lightly Doped Drain-Source) areas added on the inner sides of normal source/drain areas to suppress the occurrence of hot carriers and a reduction in breakdown voltage.

In current MOS transistors, however, the supply voltage decreases and the aforementioned purposes become less important. Thus, the concentration of the impurity in LDD areas is increased to achieve a lower resistance. This is called an extension area which is formed to have a concentration lower than that in normal source/drain areas and higher than that in conventional LDD areas.

Description is hereinafter made for a prior art of MOS transistor 10 of such structure with reference to FIG. 1. In p-channel MOS transistor 10 illustrated herein as a prior art, gate insulating film 12 in predetermined pattern and p-type gate electrode 13 are stacked in turn on the surface of an n-type area of silicon substrate 11, and side walls 14 are formed on both sides of gate insulating film 12 and gate electrode 13.

A pair of p-type source/drain areas 15 is formed in surface portions of silicon substrate 11 on the outer sides of side walls 14. A pair of p-type extension areas 16 is formed with channel area 17 interposed between them in surface portions of silicon substrate 11 on the inner sides of source/drain areas 15.

Since MOS transistor 10 of the aforementioned structure has extension areas 16 located on the inner sides of source/drain areas 15, it is possible to suppress the occurrence of hot carriers and a reduction in breakdown voltage similarly to a conventional LDD structure, and moreover, it shows a lower resistance than the conventional LDD structure.

In the aforementioned MOS transistor 10, gate insulating film 12 is formed, for example, of a thermal oxidation film of silicon substrate 11, and a p-type impurity such as boron is implanted into source/drain areas 15, extension areas 16, and gate electrode 13 for allowing them to serve as p-channels.

Now, a transistor manufacturing method of manufacturing MOS transistor 10 as described above is described in brief. The surface of silicon substrate 11 is first subjected to thermal treatment to form a thermal oxidation film on the entire surface, and gate electrode 13 is formed in a predetermined pattern on the surface of the thermal oxidation film.

Dry etching is performed with gate electrode 13 used as a mask to remove the portion of the thermal oxidation film which is not masked by gate electrode 13 from the surface of silicon substrate 11. The thermal oxidation film remaining under gate electrode 13 thus constitutes gate insulating film 12 as shown in FIG. 2A.

Next, as shown in FIG. 2B, a p-type impurity is lightly doped into the surface portions of silicon substrate 11 at the positions of extension areas 16 with gate electrode 13 used as a mask. Side walls 14 are formed on both sides of gate insulating film 12 and gate electrode 13 on the surface of silicon substrate 11 which includes the impurity ion-implanted thereinto, as shown in FIG. 2C.

Then, as shown in FIG. 2D, a p-type impurity is deeply doped into the surface portions of silicon substrate 11 at the positions of source/drain areas 15 with side walls 14 used as masks, and the impurities thus ion-implanted into silicon substrate 11 are activated through annealing to form source/drain areas 15 and extension areas 16, thereby completing p-channel MOS transistor 10 as shown in FIG. 1.

For the annealing of silicon substrate 11 to form source/drain areas 15 and extension areas 16 as described above, an RTA (Rapid Thermal Anneal) method is typically used at present. As shown in FIG. 3, in the RTA method, silicon substrate 11 placed in an atmosphere of nitrogen or argon is raised in temperature to the annealing temperature of approximately 1000 (° C.) at the maximum rate of an anneal apparatus, and then decreased in temperature to normal temperature at the maximum speed.

In this manner, since the rise and decrease in temperature are performed at the maximum speed and the rise in temperature transitions directly to the decrease in temperature as spike anneal in the RTA method, unnecessary diffusion of an impurity can be prevented to form extension areas 16 in a proper concentration with small depths of junctions with silicon substrate 11.

An alternative method of manufacturing MOS transistor 10 of the aforementioned structure is shown in FIGS. 4A to 4F. Specifically, a p-type impurity is deeply doped into silicon substrate 11 at the positions of source/drain areas 15 with side walls 14 used as masks and then annealing is performed. After side walls 14 are removed, a p-type impurity is lightly doped into silicon substrate 11 at the positions of extension areas 16 with gate electrode 13 used as a mask. Side walls 14 are again formed and then annealing is again performed.

In this case, since the first annealing for activating source/drain areas 15 is not performed in the RTA method but as normal long-duration annealing, a defect due to the ion implantation is favorably recovered. In addition, since the second annealing for activating extension areas 16 is performed in the RTA method, extension areas 16 can be formed at low resistance with small depths of the junctions.

When the impurity for extension areas 16 is activated in silicon substrate 11 as described above, the annealing of silicon substrate 11 in the RTA method can result in extension areas 16 with a small depth of the junctions at low resistance. In the aforementioned annealing which involves the rise and decrease in temperature at the maximum rate, however, excessive stress applied to portions of silicon substrate 11 and the like may cause defects such as breakage or peeling in the portions.

To solve such a problem, temperature can be decreased at a lower speed as shown in FIG. 5. However, as shown in FIG. 6A, a decrease in temperature of silicon substrate 11 which has been raised in temperature to the annealing temperature reduces the solid solubility of the ion-implanted impurity, and a decrease in temperature at a low speed causes high thermal energy to act on silicon substrate 11 and the impurity as shown in FIG. 6B.

Accordingly, the decrease in temperature at a lower speed causes the impurity with a reduced solid solubility to be acted upon by thermal energy high enough to disconnect the impurity from silicon substrate 11, which results in disconnection of the impurity from silicon substrate 11. In this case, the impurity for extension areas 16 is unnecessarily diffused to increase depths of the junctions with silicon substrate 11 and resistance.

For example, when p-type extension areas 16 are formed in p-channel MOS transistor 10 as described above, acceleration voltage for ion implantation is decreased to approximately 0.5 (kV), and the depth of extension areas 16 is decreased to approximately 40 (nm) at present. In extension areas 16 with such an extremely small depth of the junctions, the aforementioned decrease in temperature at low speed leads to considerable variations in depth of the junctions.

The aforementioned problem also occurs in an n-channel MOS transistor (not shown) including n-type extension areas 16, and occurs whether or not silicon substrate 11 to be annealed has a cover film (not shown) such as a silicon oxide film on the surface thereof.

SUMMARY OF THE INVENTION

The preset invention has been made in view of the aforementioned problem, and it is an object thereof to provide at least one of a method and an apparatus of circuit manufacture capable of achieving shallow junctions between source/drain areas and a silicon substrate at low resistance simultaneously with a reduction in stress due to a decrease in temperature of the silicon substrate or the like, a method and an apparatus of anneal control for controlling the operation of the circuit manufacture apparatus in this manner, and an information storage medium for storing a program as software for a computer which controls the operation of the circuit manufacture apparatus in this manner.

In the present invention, a silicon substrate including an impurity doped thereinto is raised in temperature to a predetermined annealing temperature, and the silicon substrate reaching the annealing temperature is then decreased in temperature at variable speeds such that the temperature is decreased at a high speed initially and at a low speed latterly. Since the speed at which the temperature of the silicon substrate is decreased is switched at a certain point from the high speed to the low speed, stress is alleviated. In addition, since the speed at which the temperature of the silicon substrate is decreased is high until that point, the impurity with a reduced solid solubility is not acted upon by thermal energy high enough to disconnect the impurity from the silicon substrate. Thus, the impurity is not disconnected from the silicon substrate and the impurity doped into the silicon substrate is not diffused unnecessarily.

In the present invention, the silicon substrate is decreased in temperature from the annealing temperature at such a speed as thermal energy to disconnect the impurity from the silicon substrate does not act on the impurity with a reduced solid solubility due to the decreased temperature. Therefore, even when the temperature of the silicon substrate reaching the annealing temperature is decreased to reduce the solid solubility of the doped impurity, the impurity is not acted upon by thermal energy high enough to disconnect the impurity from the silicon substrate, thereby causing no disconnection of the impurity from the silicon substrate.

In the present invention, after the silicon substrate including boron as a doped impurity is raised in temperature to the annealing temperature of approximately 1000 (° C.), the temperature thereof is decreased at the high speed initially and the speed is switched to the low speed at approximately 900 (° C.). Thus, even when the temperature of the silicon substrate reaching the annealing temperature of approximately 1000 (° C.) is decreased to reduce the solid solubility of the doped boron, the boron is not acted upon by thermal energy high enough to disconnect the boron from the silicon substrate, thereby causing no disconnection of the boron from the silicon substrate.

In the present invention, the silicon substrate is decreased in temperature initially at the high speed of 50 (° C./sec) or more, and from a certain point onward, at the low speed of 25 (° C./sec) or less. Since the speed at which the temperature of the silicon substrate is decreased is considerably low from that point onward, stress is alleviated. In addition, since the speed at which the temperature of the silicon substrate is decreased is considerably high until that point, the boron doped into the silicon substrate is not diffused unnecessarily.

In the present invention, wafer temperature decreasing means initially decreases the temperature of the silicon substrate at the maximum rate. Since the speed at which the temperature of the silicon substrate is decreased is considerably high initially, the boron doped into the silicon substrate is not diffused unnecessarily.

It should be noted that various means referred to in the present invention may be any which is formed to realize a function corresponding thereto. For example, dedicated hardware for producing a predetermined function, a computer provided with a predetermined function through a program, a predetermined function realized in a computer through a program, a combination thereof, and the like are allowed as such means.

The maximum rate referred to in the present invention means the maximum rate at which the wafer temperature decreasing means can decrease the temperature. For example, when the wafer temperature decreasing means is a gas supply device for supplying an anneal gas, the maximum supply speed of the anneal gas is allowed as the maximum rate.

The information storage medium referred to in the present invention may be any hardware which previously stores, as software, a program for causing a computer to execute various processing. For example, a ROM (Read Only Memory) or HDD (Hard Disc Drive) fixed in a device including a computer as part thereof, a CD (Compact Disc)-ROM or FD (Floppy Disc) loaded removably into a device including a computer as part thereof, and the like are allowed as the information storage medium.

The computer referred to in the present invention may be any device which can read a program comprising software to execute processing operations corresponding thereto. For example, a device including a CPU (Central Processing Unit) as a main portion thereof which is connected, as required, to various devices such as a ROM, RAM (Random Access Memory), and I/F (Interface) is allowed as the computer. In the present invention, the execution of various operations corresponding to software by the computer may include, for example, control of operations of various devices by the computer.

DETAILED DESCRIPTION OF THE PREFERRED EMBODIMENT

Figure 1:
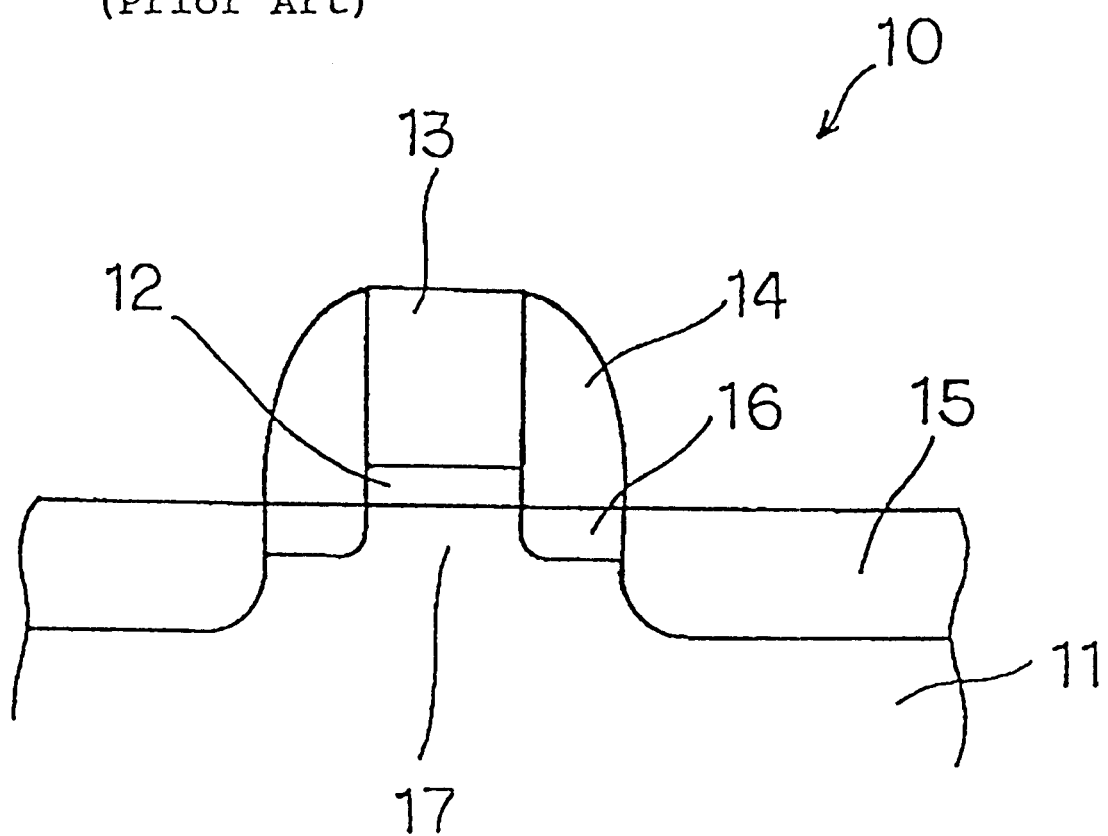
FIG. 1 is a vertical section front view schematically showing the internal structure of a MOS transistor.
Figure 2A:
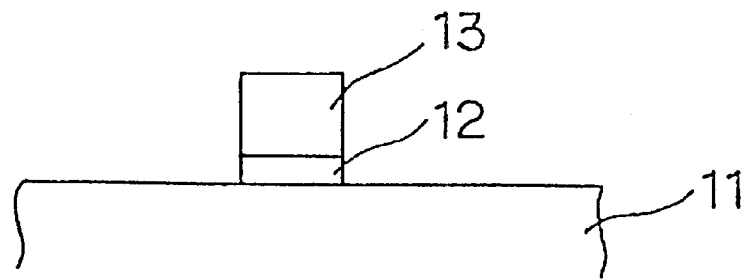
FIGS. 2A to 2D are diagrams showing steps of an exemplary method of manufacturing a MOS transistor.
Figure 2B:
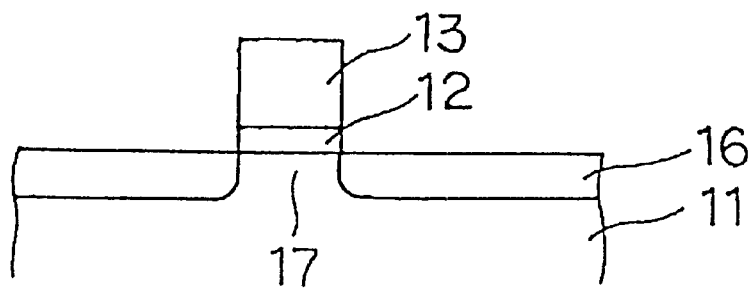
Figure 2C:
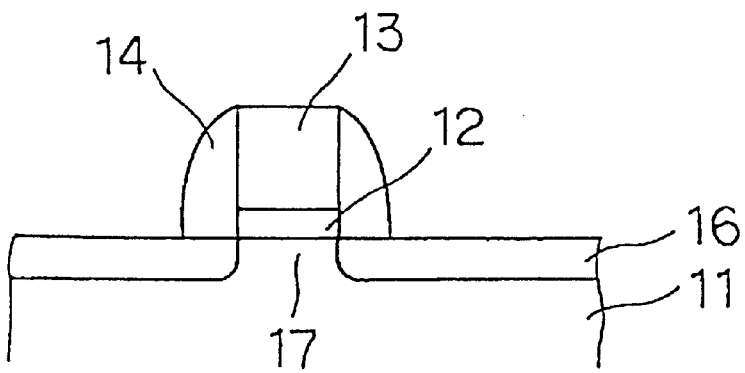
Figure 2D:
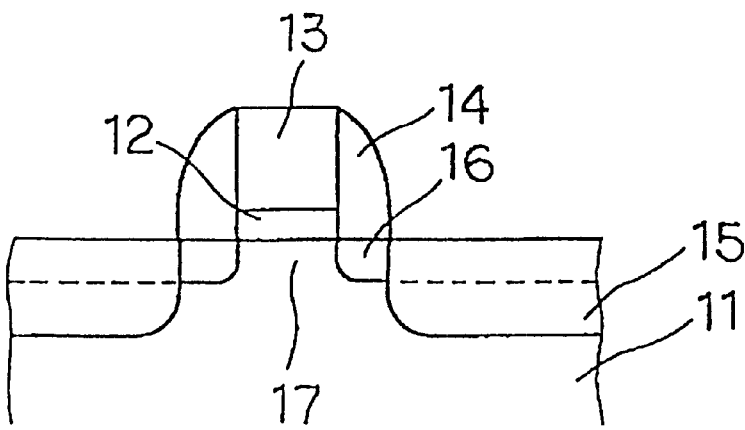
Figure 3:
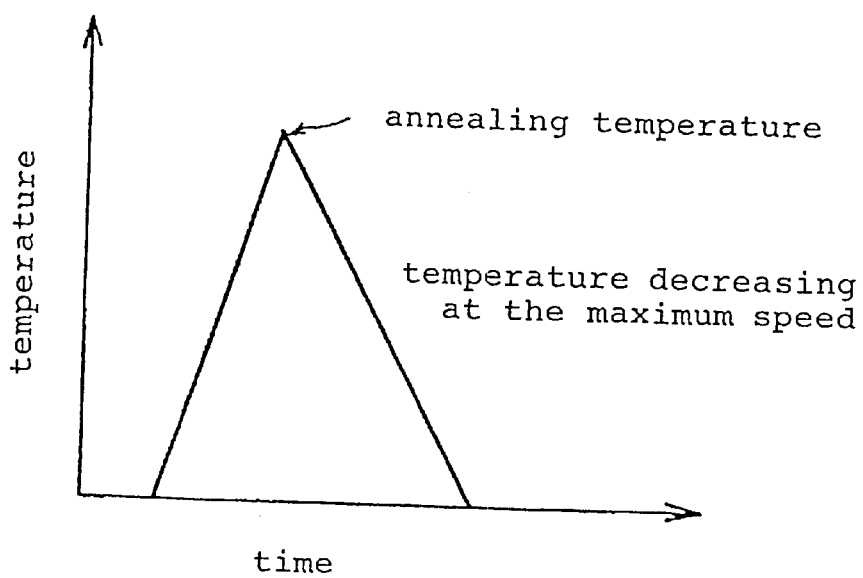
FIG. 3 is a graph showing an example of a change in temperature in a conventional circuit manufacturing method.
Figure 4A:
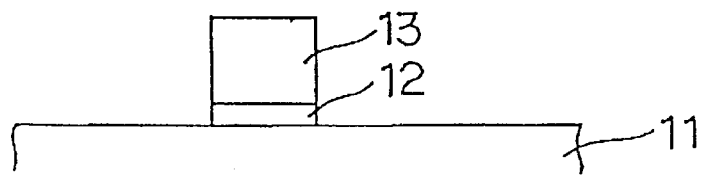
FIGS. 4A to 4F are diagrams showing steps of another exemplary method of manufacturing a MOS transistor.
Figure 4B:
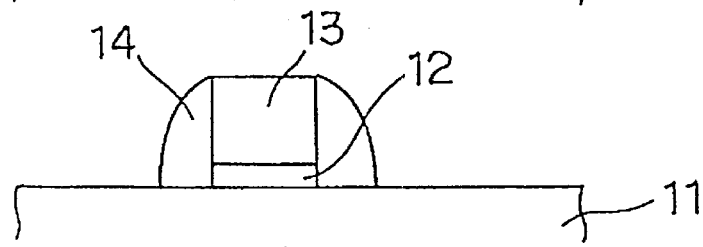
Figure 4C:
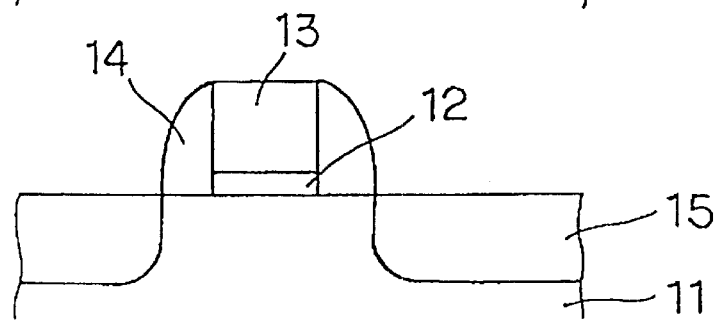
Figure 4D:
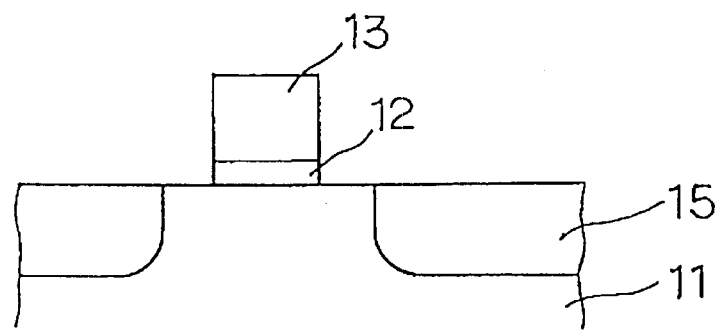
Figure 4E:
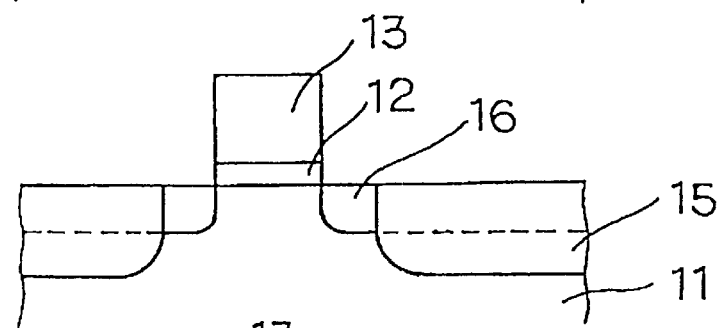
Figure 4F:
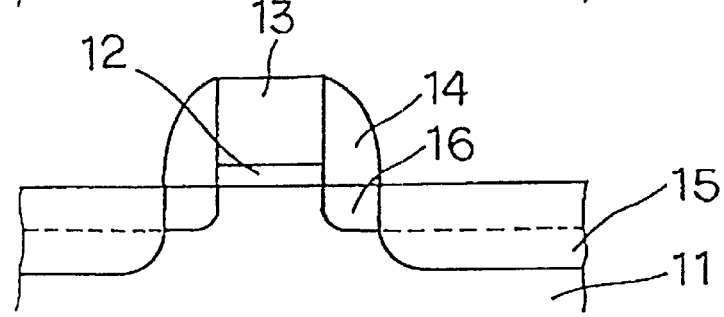
Figure 5:
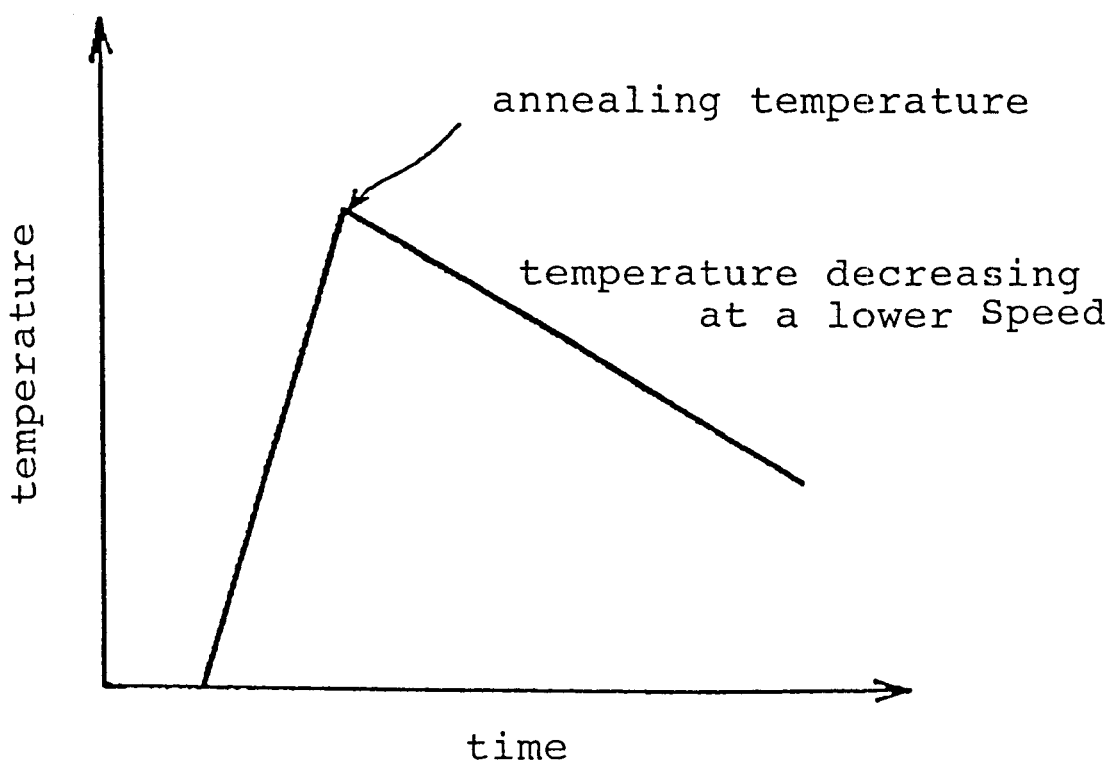
FIG. 5 is a graph showing another example of a change in temperature in a conventional circuit manufacturing method.

An embodiment of the present invention is hereinafter described with reference to FIGS. 6 to 10. It should be noted that the portions in the embodiment identical to those in the aforementioned prior art are designated with the same names, and detailed description thereof is omitted. Circuit manufacturing apparatus 20 of the embodiment comprises anneal apparatus body 21 serving as its main body and anneal control apparatus 22 serving as anneal control means which are interconnected through connectors 23.

Anneal apparatus body 21 includes holding table 201 serving as wafer holding means which is disposed inside processing chamber 202 serving as heat insulating and airproofing means. Holding table 201 removably holds silicon substrate 11. Processing chamber 202 airtightly and adiabatically accommodates silicon substrate 11 held by holding table 201.

Silicon substrate 11 includes boron ion-implanted thereinto as an impurity which is to constitute p-type extension areas 16 in p-channel MOS transistor 10. The boron is ion-implanted at an acceleration voltage of 0.5 (kv) to a depth of 40 (nm).

Paired lamp units 203 corresponding to wafer temperature raising means are individually disposed over and under processing chamber 202. Gas unit 204 corresponding to wafer temperature decreasing means is connected into processing chamber 202 through piping. Lamp units 203 raise the temperature of silicon substrate 11 held by holding table 201 with light. Gas unit 204 supplies an anneal gas comprising nitrogen or argon to the position of silicon substrate 11 held by holding table 201.

Figure 9:
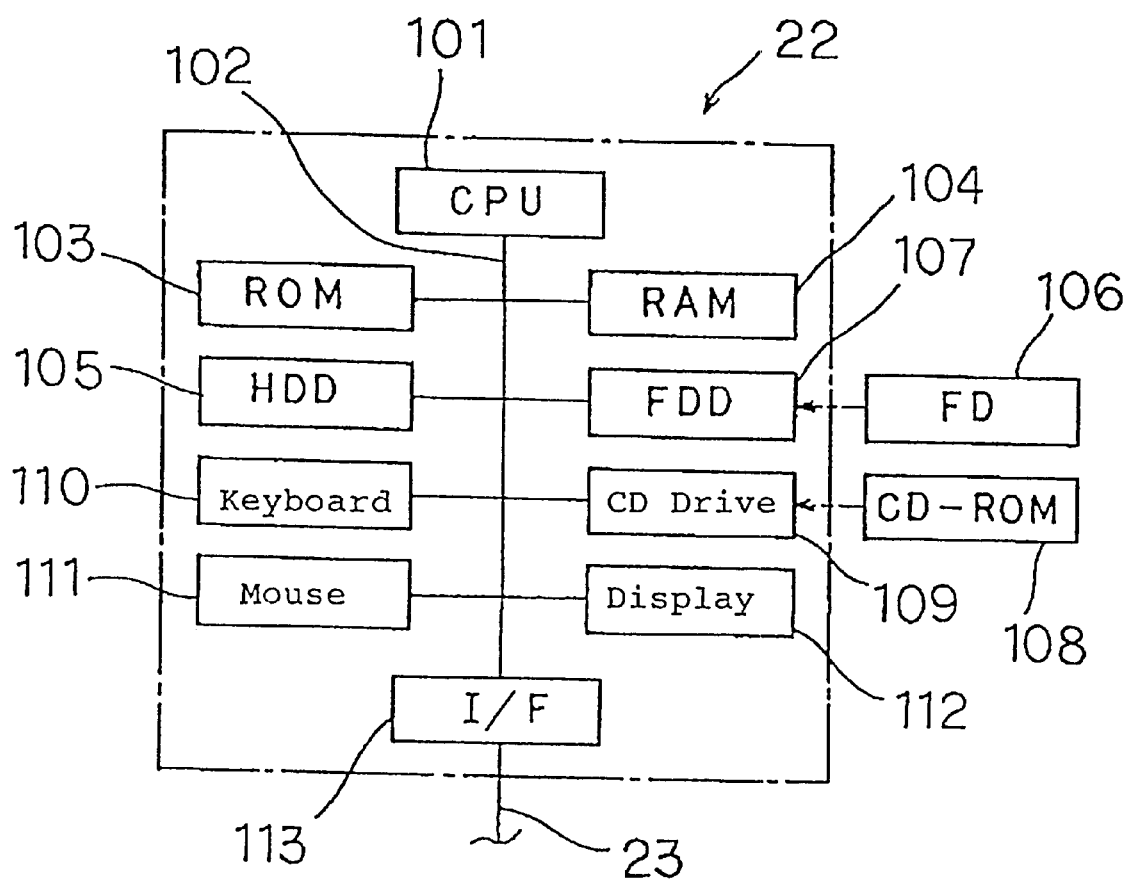
FIG. 9 is a block diagram showing an anneal control apparatus.

Anneal control apparatus 202 is formed of a so-called computer system, and comprises CPU 101 as hardware which serves as a main unit of the computer as shown in FIG. 9. CPU 101 is connected through bus lines 102 to hardware such as ROM 103, RAM 104, HDD 105, FDD (FD Drive) 107 removably loaded with FD 106, CD drive 109 removably loaded with CD-ROM 108, keyboard 110, mouse 111, display 112, communication I/F 113 and the like. Communication I/F 113 is connected to connector 23 which is connected to lamp units 203 and gas unit 204 of anneal apparatus body 21.

In circuit manufacturing apparatus 20 of the embodiment, pieces of hardware such as ROM 103, RAM 104, HDD 105, removable FD 106, and removable CD-ROM 108 correspond to information storage media. A control program and various data required for various operations of anneal control apparatus 22 are stored as software in at least one of the pieces of hardware.

For example, a control program for causing CPU 101 to execute various processing operations is previously stored in FD 106 or CD-ROM 108. Such software is previously installed onto HDD 105, and copied to RAM 104 and read by CPU 101 at the start of anneal control apparatus 22.

CPU 101 reads a proper program to execute various processing operations corresponding thereto in this manner, thereby allowing anneal control apparatus 22 of the embodiment to integrally control the operations of lamp units 203 and gas unit 204 of anneal apparatus body 21.

Specifically, anneal control apparatus 22 of the embodiment causes gas unit 204 to supply the anneal gas at a low speed and lamp units 203 to be lit for raising the temperature of silicon substrate 11 to a predetermined annealing temperature, while it causes lamp units 203 to be extinguished and gas unit 204 to supply the anneal gas at a high speed for decreasing the temperature of silicon substrate 11 from the annealing temperature to normal temperature.

When silicon substrate 11 is decreased in temperature with the gas supplied by gas unit 204 in this manner, anneal control apparatus 22 can change the speed at which the temperature is decreased such that the impurity with a reduced solid solubility due to the decreased temperature is not acted upon by thermal energy to disconnect the impurity from silicon substrate 11.

More specifically, if boron is ion-implanted into silicon substrate 11 as the impurity, anneal control apparatus 22 cause gas unit 204 to supply the anneal gas at a predetermined low speed and lamp units 23 to be lit until the temperature of silicon substrate 11 is raised to the annealing temperature of 1000 (° C.).

Immediately after the temperature of silicon substrate 11 is raised to the annealing temperature of 1000 (° C.), anneal control apparatus 22 transitions to a temperature decrease operation. It causes lamp units 23 to be extinguished and gas unit 204 to supply the gas at the maximum rate, thereby decreasing the temperature of silicon substrate 11 to 900 (° C.) at a high speed of 50 (° C./sec) or more. After the temperature of silicon substrate 11 reaches 900 (° C.), it takes measures such as increasing or reducing the gas supply from by gas unit 204 to slow down the decrease in temperature to a low speed of 25 (° C./sec) or less.

The control function of anneal control apparatus 22 as described above is realized by using various hardware as required. The main portion thereof is realized by CPU 101, which is hardware of the computer, functioning in accordance with the software stored in the information storage media such as RAM 104.

Such software is stored in the information storage media such as RAM 104 as a control program for allowing CPU 101 or the like to execute processing operations including, for example, causing lamp units 203 to raise the temperature of silicon substrate 11 to the predetermined annealing temperature at the maximum rate, and then causing gas unit 204 to decrease the temperature of silicon substrate 11 at variable speeds such that the temperature is decreased at a high speed initially and at a low speed latterly.

Figure 8:
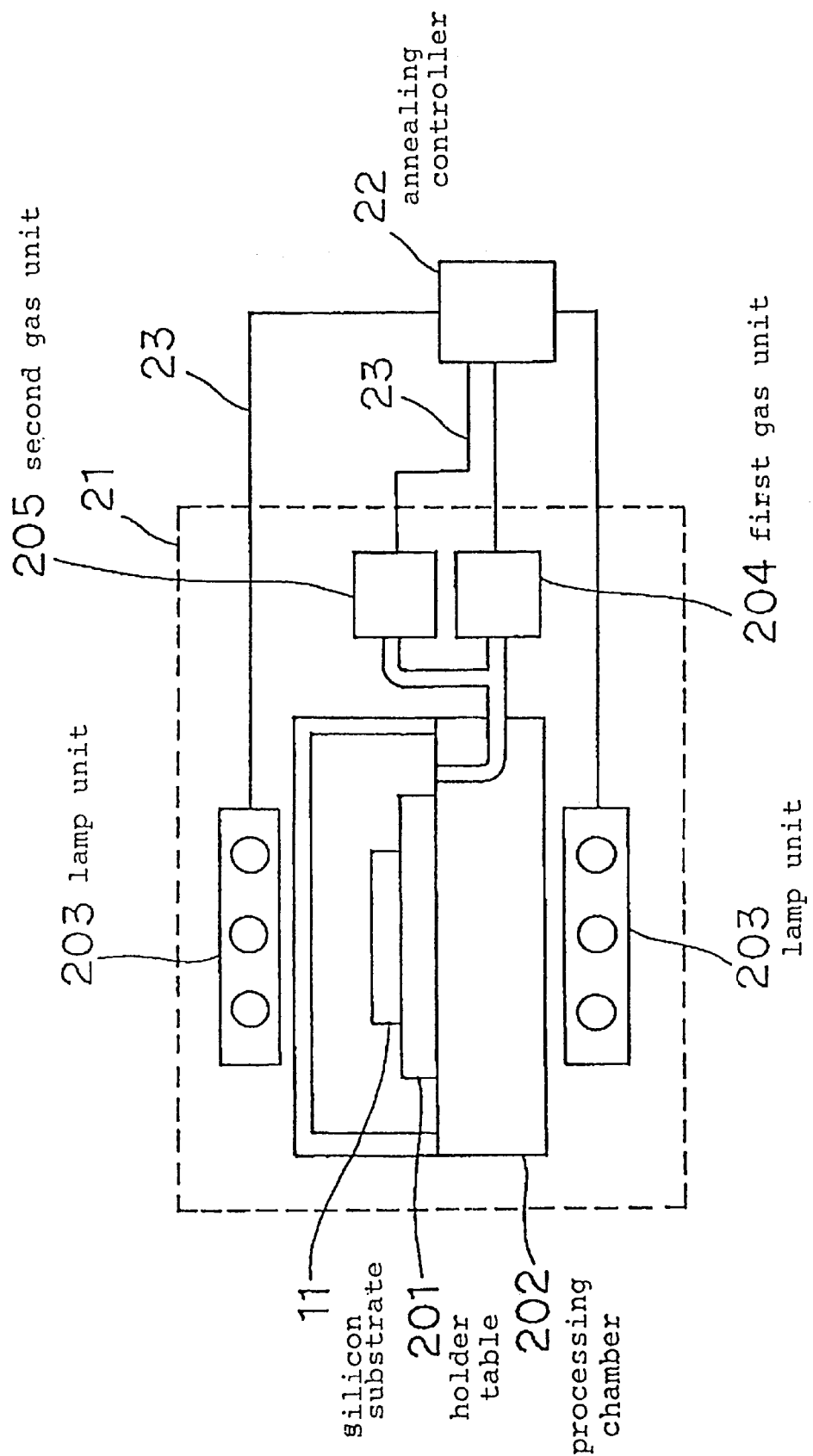
FIG. 8 is a vertical section front view schematically showing the entire structure of a circuit manufacturing apparatus.

In the aforementioned configuration, circuit manufacturing apparatus 20 of the embodiment also performs annealing to activate the impurity ion-implanted into silicon substrate 11. In such a case, as shown in FIG. 8, silicon substrate 11 including the impurity ion-implanted thereinto is held by holding table 201 within processing chamber 202 and anneal control apparatus 22 controls the operations of lamp units 203 and gas unit 204 of anneal apparatus body 21.

Figure 7:
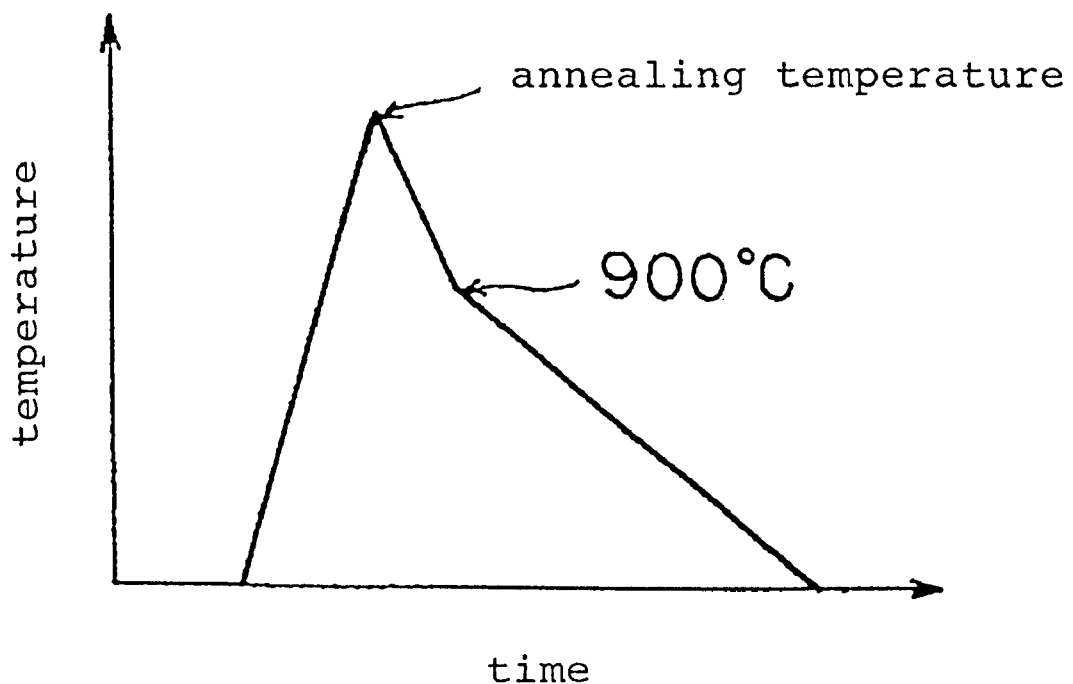
FIG. 7 is a graph showing an example of a change in temperature in a circuit manufacturing method according to an embodiment of the present invention.
Figure 10:
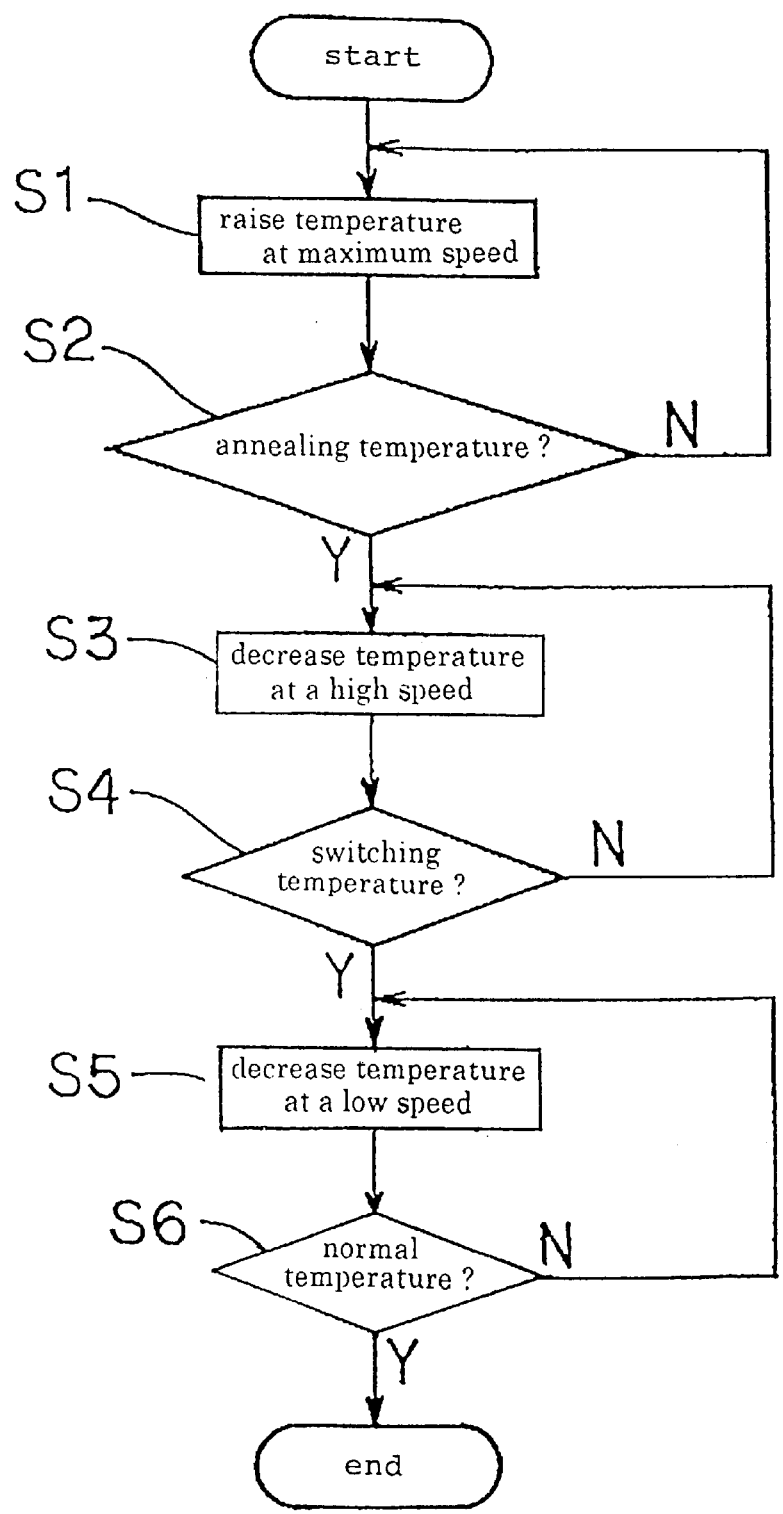
FIG. 10 is a flow chart showing the circuit manufacturing method with the circuit manufacturing apparatus.

Then, as shown in FIGS. 7 and 10, anneal control apparatus 22 causes lamp units 203 to raise the temperature of silicon substrate 11 to the predetermined annealing temperature at the maximum rate (step S1), and immediately after the temperature of silicon substrate 11 reaches the annealing temperature, a decrease in temperature is started (step S2).

Silicon substrate 11 is subjected to annealing in the RTA method as spike anneal. For example, when boron is ion-implanted as the impurity, silicon substrate 11 is raised in temperature by lamp units 203 to the annealing temperature of 1000 (° C.), and immediately afterward, the temperature is decreased by gas unit 204.

In the circuit manufacturing method with circuit manufacturing apparatus 20 of the embodiment, however, silicon substrate 11 is decreased in temperature initially at a high speed of 50 (° C./sec) or more by full supply of the gas from gas unit 204 (step S3), and when the temperature of silicon substrate 11 reaches 900 (° C.) (step S4), the gas supply from gas unit 204 is increased or reduced to slow down the decrease in temperature to 25 (° C./sec) or less (step S5).

In the circuit manufacturing method with circuit manufacturing apparatus 20 of the embodiment, since the decrease in temperature of silicon substrate 11 is slowed down at a certain point as described above, stress is alleviated to allow prevention of breakage and peeling in portions of substrate 11. In addition, since the decrease in temperature of silicon substrate 11 is performed at a high speed until that point, thermal energy high enough to disconnect the impurity from silicon substrate 11 does not act on the impurity with a reduced solid solubility.

Thus, the impurity is not disconnected from silicon substrate 11, and the impurity ion-implanted into silicon substrate 11 is not diffused unnecessarily. As a result, the junction between the impurity and silicon substrate 11 is maintained shallow to enable prevention of an increase in resistance as well.

Figure 6A:
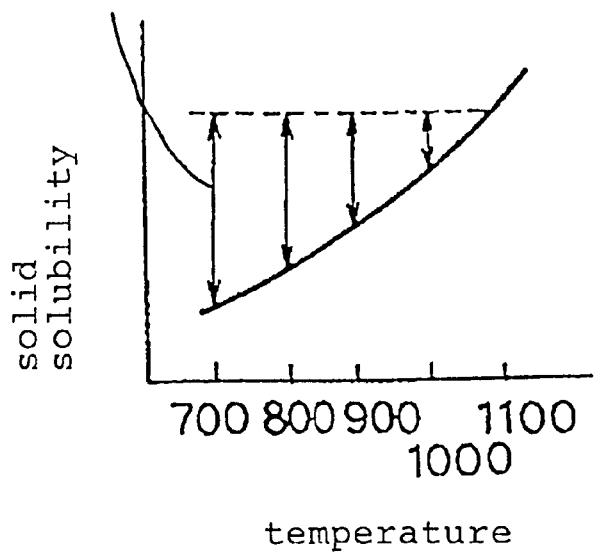
FIG. 6A is a graph showing a relationship between solid solubility of an impurity and temperature.

Description is hereinafter described for a mechanism to decrease temperature in the circuit manufacturing method with circuit manufacturing apparatus 20 of the embodiment. As shown in FIG. 6A, since a decrease in temperature of silicon substrate 11 which has reached the annealing temperature causes a reduction in solid solubility of the ion-implanted impurity, the impurity is readily disconnected from silicon substrate 11.

Figure 6B:
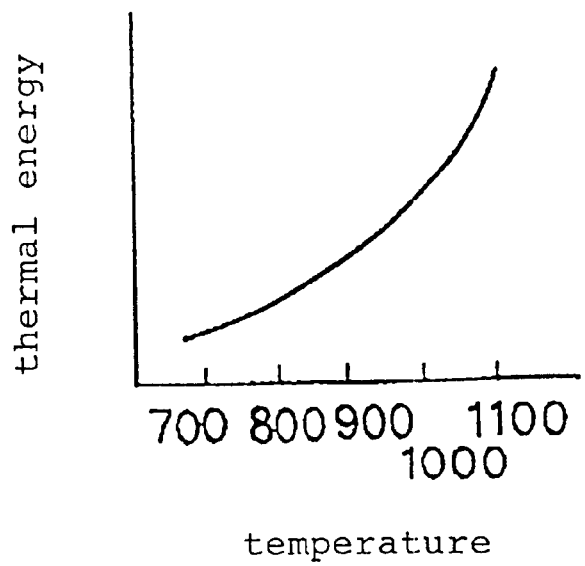
FIG. 6B is a graph showing a relationship between energy for disconnecting an impurity from a silicon substrate and temperature.

The disconnection of the impurity from silicon substrate 11, however, requires sufficient thermal energy. As shown in FIG. 6B, the thermal energy necessarily becomes larger as the temperature of silicon substrate 11 is higher. In other words, the impurity is more readily disconnected from silicon substrate 11 at a lower temperature in terms of the solid solubility, and at a higher temperature in terms of the thermal energy.

It has been shown from an investigation by the inventors that, when boron is ion-implanted into silicon substrate 11 at an acceleration voltage of 0.5 (kV) to a depth of 40 (nm) as described above, a time period required for disconnecting the boron from silicon substrate 11 is approximately 0.5 (min) at 900 (° C.), approximately 5.0 (min) at 800 (° C.), and approximately 60 (min) at 900 (° C.).

Therefore, the boron is disconnected from silicon substrate 11 if decreasing the temperature of silicon substrate 11 from 1000 (° C.) to 900 (° C.) takes 0.5 (min) or more.

Similarly, if decreasing the temperature of silicon substrate 11 to 800 (° C.) takes 5.0 (min) or more, or if decreasing the temperature to 700 (° C.) takes 60 (min) or more, the boron is disconnected from silicon substrate 11.

In other words, if decreasing the temperature of silicon substrate 11 from 1000 (° C.) to 900 (° C.) takes a time period significantly shorter than 0.5 (min), the disconnection of the boron from silicon substrate 11 can be prevented. Similarly, time periods significantly shorter than 5.0 and 60 (min) are allowed for decreasing the temperature to 800 and 700 (° C.), respectively.

When attention is given to the relationship between temperature and time, the allowed time period becomes longer sharply as the temperature decreases. This means that the decrease in temperature of silicon substrate 11 which has reached the annealing temperature need be performed fast at high temperatures but may be performed slowly at low temperatures.

Thus, the speed at which the temperature is decreased is changed such that the temperature is decreased at the lowest possible speed within a range in which the impurity with a reduced solid solubility due to the decreased temperature is not acted upon by thermal energy to disconnect the impurity from silicon substrate 11. As a result, the impurity ion-implanted into silicon substrate 11 is not diffused unnecessarily and stress on silicon substrate or the like can be minimized. It is actually difficult, however, to appropriately change in unlimited number of stages the speed at which the temperature of silicon substrate 11 is decreased from a high temperature of 1000 (° C.) to normal temperature in accordance with the temperature.

For this reason, in the circuit manufacturing method with circuit manufacturing apparatus 200 of the embodiment, when boron is used as the impurity, the decrease in temperature is performed initially at the minimum speed of 50 (° C./sec) or more by full supply of the gas from gas unit 204, and when the temperature of silicon substrate 11 is decreased to 900 (° C.), the decrease in temperature is slowed down to 25 (° C./sec) or less. Since this can achieve a virtually proper changing rate in temperature decreasing speed with simple operations, and stress on silicon substrate 11 can be reduced while a shallow junction is obtained between the impurity and silicon substrate 11 at low resistance.

The present invention is not limited to the aforementioned embodiment, and various modifications are permitted without departing from the gist thereof. For example, while the aforementioned embodiment assumes that the temperature decreasing speed is switched in response to the detection of the decrease in temperature of silicon substrate 11 from 1000 (° C.) to 900 (° C.), the switch of the temperature decreasing speed can be controlled on the basis of time. In addition, the aforementioned embodiment illustrates increasing or reducing of the supply speed of the anneal gas from gas unit 204 when the temperature decreasing speed is changed to a lower speed, lamp units 203 may be lit feebly instead.

While the aforementioned embodiment illustrates the supply of the same anneal gas when the temperature of silicon substrate 11 is raised and decreased, anneal gases may be switched in raising and decreasing the temperature. For example, a first anneal gas such as argon which does not react with silicon substrate 11 is supplied when the temperature of silicon substrate 11 is raised to allow prevention of unnecessary reaction such as nitriding of silicon substrate 11 to be raised in temperature.

On the other hand, a second anneal gas such as nitrogen with high thermal conductivity is supplied when silicon substrate 11 is decreased in temperature to allow a fast decrease in temperature of silicon substrate 11. It is thus possible to more favorably prevent unnecessary diffusion of the impurity for extension areas 16.

In addition, the aforementioned embodiment illustrates the annealing for activating p-type areas 15, 16 in p-channel MOS transistor 10, the annealing of the present invention can activate an n-type area in an n-channel MOS transistor, or activate a p-type area and an n-type area simultaneously in a CMOS (Complementary MOS) transistor. The annealing of the present invention can be used for various circuits with a silicon substrate including an impurity ion-implanted thereinto.

While the aforementioned embodiment assumes that no cover film (not shown) such as a silicon oxide film is present on the surface of silicon substrate 11 to be annealed, such a film may be present, or oxygen may be present in an atmosphere for annealing.

The aforementioned embodiment illustrates the logical implementation of various means as various functions of anneal control apparatus 22 by CPU 101 operating in accordance with the control program stored as software in RMA 104 or the like. Each of various means, however, may be formed as unique hardware, or some of them may be stored as software in RAM 104 or the like and others may be formed as hardware.

The aforementioned embodiment assumes that the software previously installed onto HDD 105 from CD-ROM 108 or the like is copied to RAM 104 at the start of anneal control apparatus 22, and the software thus stored in RAM 104 is read by CPU 101. Such software stored in HDD 105, however, may be used directly by CPU 101, or may be previously stored in ROM 103 in a fixed manner.

In addition, software may be stored in FD 106 or CD-ROM 108 which is an information storage medium handleable alone and then installed from FD 106 or the like onto HDD 105 or RAM 104. The software, however, may be read directly from FD 106 by CPU 101 to execute processing operations without performing such installation.

In other words, when various means of anneal control apparatus 22 of the present invention is implemented by software, it is essential only that the software can be read by CPU 101 to execute operations corresponding thereto. The control program for implementing the aforementioned various means may be formed of a combination of pieces of software, and in such a case, only minimum software for realizing anneal control apparatus 22 of the present invention may be stored in an information storage medium which is a discrete product.

For example, when anneal control apparatus 22 equipped with an existing operating system is provided with application software in an information storage such as CD-ROM 108, part of software depending on the operating system can be omitted from the applications software in the information storage medium since software for implementing various means of anneal control apparatus 22 of the present invention is realized by a combination of the application software and the operating system.

The method of supplying the software described in the information storage medium to CPU 101 is not limited to the direct loading of the information storage medium into anneal control apparatus 22. For example, it is possible that the aforementioned software is stored in an information storage medium in a host computer which is connected to a terminal computer through a communication network such that the software is supplied from the host computer to the terminal computer with data communication.

In the aforementioned case, while the terminal computer may execute standalone processing operations with the software downloaded to its own information storage medium, the terminal computer may execute processing operations through real-time data communication with the host computer without downloading the software. In this case, the whole system including the host computer and the terminal computer connected to each other through the communication network corresponds to anneal control apparatus 22 of the present invention.

In the present invention according to claims 1 and 2, a silicon substrate including an impurity doped thereinto is raised in temperature to a predetermined annealing temperature, and the silicon substrate reaching the annealing temperature is decreased in temperature at variable speeds such that the temperature is decreased at a high speed initially and at a low speed latterly. Since the decrease in temperature of the silicon substrate is switched to the low speed at a certain point, stress on portions in the silicon substrate or layered films can be alleviated to prevent breakage or peeling. In addition, since the temperature of silicon the silicon substrate is decreased at the high speed initially, unnecessary diffusion of the impurity doped into the silicon substrate can be prevented to maintain a shallow junction between the impurity and the silicon substrate, thereby making is possible to prevent an increase in resistance.

In the present invention according to claims 3 to 4, the silicon substrate is decreased in temperature from the annealing temperature at such a speed as the impurity with a reduced solid solubility due to the decreased temperature is not acted upon by thermal energy to disconnect the impurity from the silicon substrate. Accordingly, the impurity is not disconnected from the silicon substrate to enable prevention of unnecessary diffusion of the impurity doped into the silicon substrate.

In the present invention according to claims 5 to 8, after the silicon substrate including boron as a doped impurity is raised in temperature to the annealing temperature of approximately 1000 (° C.), the temperature thereof is decreased such that the temperature decreasing speed is switched from a high speed to a low speed at approximately 900 (° C.). It is thus possible to prevent unnecessary diffusion of the boron while stress on the silicon substrate and the like is alleviated with simple operations.

In the present invention according to claims 9 to 12, the silicon substrate is decreased in temperature initially at a high speed of 50 (° C./sec) or more and at a low speed of 25 (° C./sec) or less from a certain point onward. The temperature decreasing speed for the silicon substrate reduced sufficiently from that point onward can satisfactorily alleviate stress on portions in the silicon substrate and layered films. In addition, the decrease in temperature of the silicon substrate at the sufficiently high speed until that point can favorably prevent unnecessary diffusion of boron.

What is claimed is:

1. A method of manufacturing a circuit, for activating an impurity doped into a silicon substrate through annealing, comprising the steps of:

raising a temperature of said silicon substrate to a predetermined annealing temperature; and decreasing the temperature of said silicon substrate which has reached the annealing temperature at variable speeds such that the temperature is decreased at a high speed initially and at a low speed latterly.

2. A method of manufacturing a circuit, for activating an impurity doped into a silicon substrate through annealing to form a pair of lightly doped shallow areas on inner sides of deeply doped source/drain areas of a MOS (Metal Oxide Semiconductor) transistor, comprising the steps of:

raising a temperature of said silicon substrate to a predetermined annealing temperature; and decreasing the temperature of said silicon substrate which has reached the annealing temperature at variable speeds such that the temperature is decreased at a high speed initially and at a low speed latterly to form said pair of lightly doped shallow areas.

3. The method of manufacturing a circuit according to claim 1, wherein a speed at which the temperature of said silicon substrate is decreased from the annealing temperature is set such that said impurity with a reduced solid solubility due to the decreased temperature is not acted upon by thermal energy to disconnect said impurity from said silicon substrate.

4. The method of manufacturing a circuit according to claim 2, wherein a speed at which the temperature of said silicon substrate is decreased from the annealing temperature is set such that said impurity with a reduced solid solubility due to the decreased temperature is not acted upon by thermal energy to disconnect said impurity from said silicon substrate.

5. The method of manufacturing a circuit according to any one of claim 1, wherein after said silicon substrate is raised in temperature to the annealing temperature of approximately 1000 (° C.), the temperature is decreased such that a temperature decreasing speed is switched from a high speed to a low speed at approximately 900 (° C.) when said impurity doped into said silicon substrate is boron.

6. The method of manufacturing a circuit according to any one of claim 2, wherein after said silicon substrate is raised in temperature to the annealing temperature of approximately 1000 (° C.), the temperature is decreased such that a temperature decreasing speed is switched from a high speed to a low speed at approximately 900 (° C.) when said impurity doped into said silicon substrate is boron.

7. The method of manufacturing a circuit according to any one of claim 3, wherein after said silicon substrate is raised in temperature to the annealing temperature of approximately 1000 (° C.), the temperature is decreased such that a temperature decreasing speed is switched from a high speed to a low speed at approximately 900 (° C.) when said impurity doped into said silicon substrate is boron.

8. The method of manufacturing a circuit according to any one of claim 4, wherein after said silicon substrate is raised in temperature to the annealing temperature of approximately 1000 (° C.), the temperature is decreased such that a temperature decreasing speed is switched from a high speed to a low speed at approximately 900 (° C.) when said impurity doped into said silicon substrate is boron.

9. The method of manufacturing a circuit according to claim 5, wherein said silicon substrate is decreased in temperature initially at a high speed of 50 (° C./sec) or more and at a low speed of 25 (° C./sec) or less from a certain point onward.

10. The method of manufacturing a circuit according to claim 6, wherein said silicon substrate is decreased in temperature initially at a high speed of 50 (° C./sec) or more and at a low speed of 25 (° C./sec) or less from a certain point onward.

11. The method of manufacturing a circuit according to claim 7, wherein said silicon substrate is decreased in temperature initially at a high speed of 50 (° C./sec) or more and at a low speed of 25 (° C./sec) or less from a certain point onward.

12. The method of manufacturing a circuit according to claim 8, wherein said silicon substrate is decreased in temperature initially at a high speed of 50 (° C./sec) or more and at a low speed of 25 (° C./sec) or less from a certain point onward.

* * * * *